United States Patent
Sze et al.

(10) Patent No.: US 11,622,485 B1
(45) Date of Patent: Apr. 4, 2023

(54) FLEXURAL PICK ARM FOR A PICK AND PLACE APPARATUS

(71) Applicant: ASMPT SINGAPORE PTE. LTD., Singapore (SG)

(72) Inventors: Chak Tong Sze, Hong Kong (HK); Pei Wei Tsai, Hong Kong (HK); Wing Sze Chan, Hong Kong (HK); Wai Hing Yung, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 44 days.

(21) Appl. No.: 17/481,390

(22) Filed: Sep. 22, 2021

(51) Int. Cl.
*H05K 13/04* (2006.01)
*B65G 47/90* (2006.01)

(52) U.S. Cl.
CPC ......... *H05K 13/0404* (2013.01); *B65G 47/90* (2013.01); *H05K 13/041* (2018.08); *H05K 13/0409* (2018.08); *H05K 13/0486* (2013.01)

(58) Field of Classification Search
CPC ....... H05K 13/0404; B25J 9/0078; B25J 9/00; B25J 15/12; B25J 18/02; H01L 41/00
See application file for complete search history.

(56) References Cited

U.S. PATENT DOCUMENTS

| | | | | |
|---|---|---|---|---|
| 4,872,803 A | * | 10/1989 | Asakawa | B25J 9/1015 414/730 |
| 5,297,443 A | | 3/1994 | Wentz | 74/490.04 |
| 9,606,171 B2 | * | 3/2017 | Cheung | G01R 31/2893 |
| 10,093,491 B2 | * | 10/2018 | Tam | B65G 47/904 |
| 2019/0139795 A1 | * | 5/2019 | Neo | H01L 21/681 |

FOREIGN PATENT DOCUMENTS

| | | |
|---|---|---|
| CN | 107671854 A | 2/2018 |
| CN | 112091940 A | 12/2020 |

OTHER PUBLICATIONS

Taiwanese Office Action, dated May 6, 2022, issued in corresponding Taiwanese Patent Application No. 110139157. English translation of Search Report.

* cited by examiner

*Primary Examiner* — Ronald P Jarrett
(74) *Attorney, Agent, or Firm* — Ostrolenk Faber LLP

(57) ABSTRACT

A pick arm for a pick and place apparatus for electronic devices has a main body having a proximal end whereat the pick arm is mountable onto a pick arm support, and a distal end at which a collet is mounted for holding an electronic device. A first rigid body is located adjacent to the proximal end of the pick arm and a second rigid body is located adjacent to the distal end of the pick arm. The first and second flexures connect the first rigid body to the second rigid body. Moreover, the first flexure is spaced from the second flexure, and the first and second flexures have opposing faces that are arranged substantially parallel to each other. An actuator is operative to apply a biasing force onto the second rigid body so as to bend the first and second flexures relative to the first rigid body for biasing the collet of the pick arm to move.

16 Claims, 3 Drawing Sheets

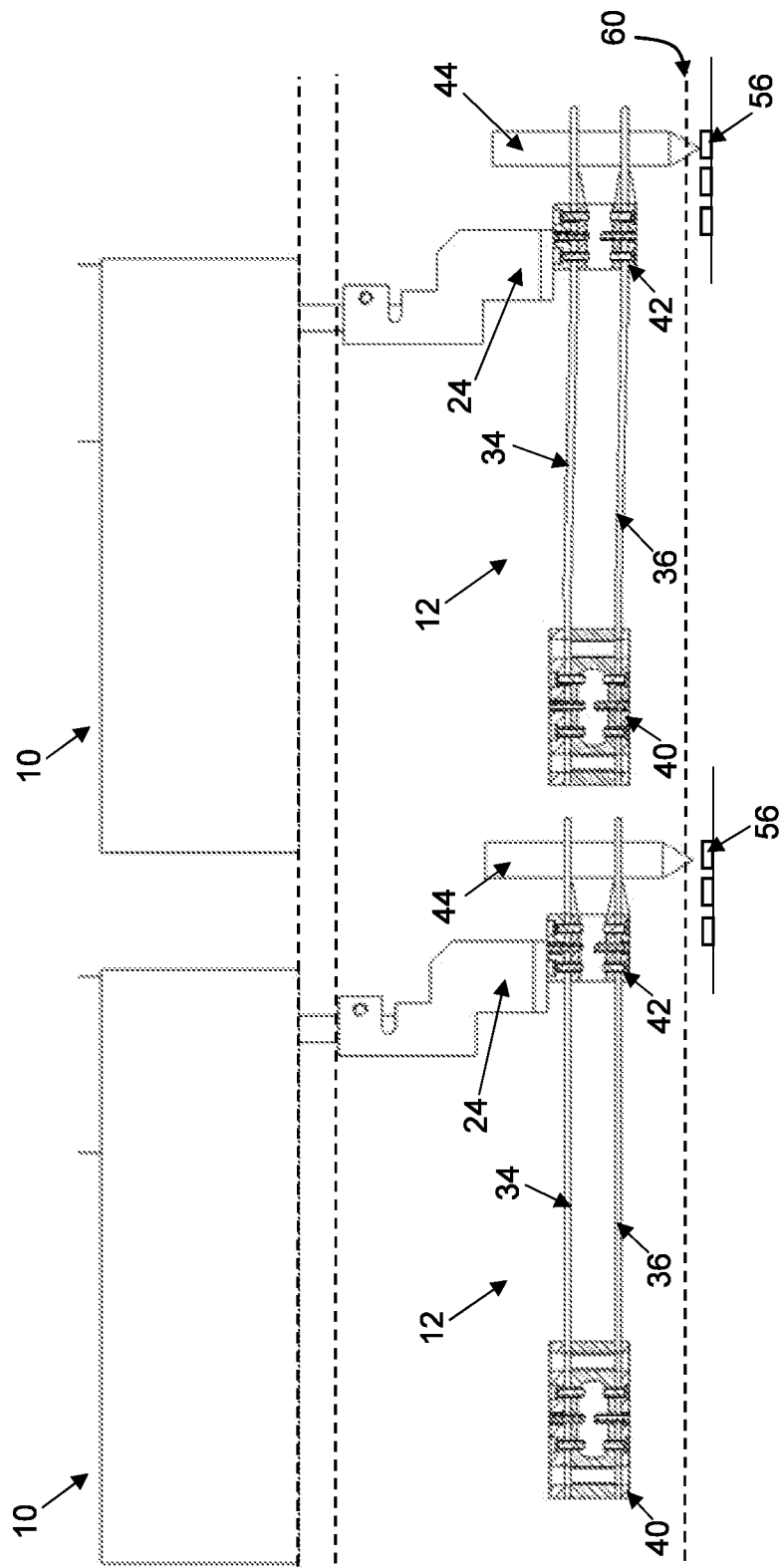

FLEXURAL PICK ARM FOR A PICK AND PLACE APPARATUS

FIELD OF THE INVENTION

This invention relates to a pick arm for a pick and place apparatus, such as a bonder for electronic devices which picks up electronic devices for bonding.

BACKGROUND

Bonders for electronic devices that are used in the semiconductor packaging industry have one or more pick arms for bonding electronic devices, such as semiconductor dice or chips. It is typically necessary to design the pick arms for both rotary/linear and vertical motion in the course of a pick and place operation, which involves picking up an electronic device from a supply of electronic devices at one location, and bonding the electronic device onto a substrate at another location.

Specifically as regards a mechanism for moving the pick arm along a vertical axis, a bearing device is conventionally used for guiding such motion. The bearing device may for instance comprise a cross-roller guide, a linear motion guide, or a cage bearing. Such bearing devices may be used together with a spring pivot on a cantilever arm for introducing some degree of compliance along the vertical axis. Other advanced pick arm designs may also use a bearing device for motion along the vertical axis, as well as a linear motor designed to enable additional small micro vertical movements in the pick arm.

However, bearing devices like those mentioned above will unavoidably increase the load carried by a bond head module of the bonder, and increase a moment of inertia of the bond head module, which is a significant shortcoming if the bond head module is to be used in a high-speed die bonding system. Moreover, these bearing devices will have an axial clearance, which will induce side play or end-point vibration during pick and place operations, thereby inducing poor positional accuracy. Furthermore, such bearing devices require periodic maintenance, which is undesirable as the longevity of the bond head lifetime may be reduced due to inadequate maintenance. From the production and design points of view, the implementation of such bearing devices further increases the complexity of the bond arm structure, and the total number of parts used in the bond arm module that have to be maintained or replaced, leading to an increase in operational costs.

It would be beneficial to be able reduce the use of a bearing device in pick arm so as to avoid at least some of the aforesaid shortcomings faced by conventional pick and place apparatus utilizing such bearing devices.

SUMMARY OF THE INVENTION

It is thus an object of this invention to seek to provide an improved pick arm for a pick and place apparatus which utilizes flexures in place of at least one conventional bearing device for enhancing the performance of the pick arm.

Accordingly, the invention provides a pick arm for a pick and place apparatus for electronic devices, comprising: a main body having a proximal end whereat the pick arm is mountable onto a pick arm support, and a distal end at which a collet is mounted for holding an electronic device; a first rigid body located adjacent to the proximal end of the pick arm and a second rigid body located adjacent to the distal end of the pick arm first and second flexures connecting the first rigid body to the second rigid body, the first flexure being spaced from the second flexure, and the first and second flexures having opposing faces that are arranged substantially parallel to each other; and an actuator operative to apply a biasing force onto the second rigid body so as to bend the first and second flexures relative to the first rigid body for biasing the collet of the pick arm to move.

These and other features, aspects, and advantages will become better understood with regard to the description section, appended claims, and accompanying drawings.

BRIEF DESCRIPTION OF THE DRAWINGS

An embodiment of the present invention will now be described, by way of example only, with reference to the accompanying drawings, in which:

FIG. 6A is an illustration of the pick arm at a standby position and FIG. 6B is an illustration of the pick arm after a vertical force is exerted on the pick arm to cause the collet to contact an electronic device.

In the drawings, like parts are denoted by like reference numerals.

DETAILED DESCRIPTION OF THE PREFERRED EMBODIMENT OF THE INVENTION

Figure 1:
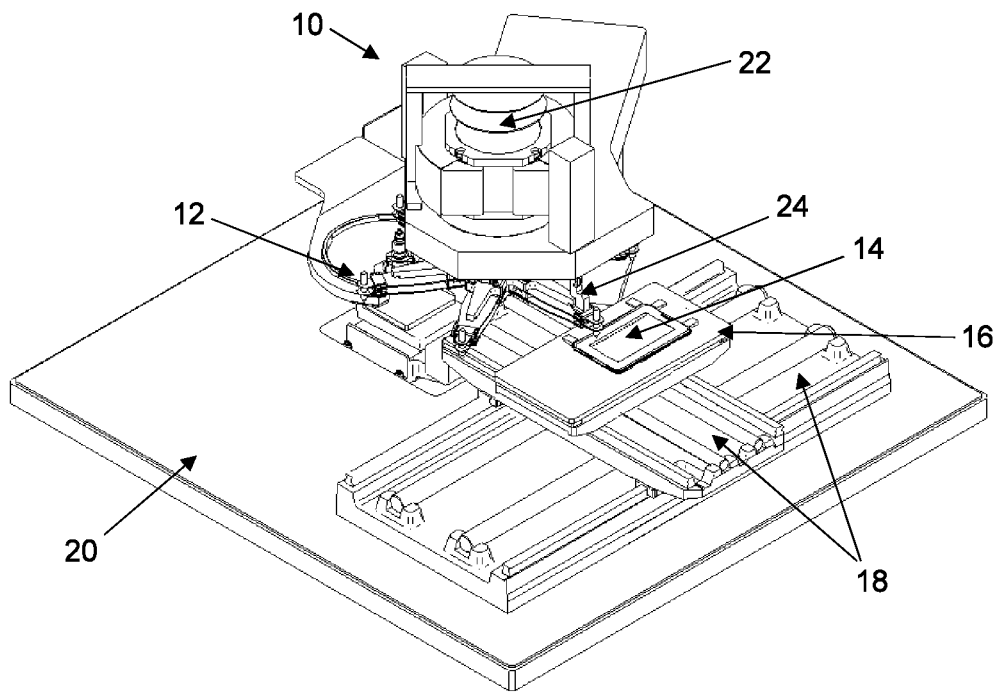
FIG. 1 is an isometric view of a bonding apparatus that incorporates multiple pick arms in accordance with the preferred embodiment of the present invention.

FIG. 1 is an isometric view of a pick and place or bonding apparatus that incorporates multiple pick arms 12 in accordance with the preferred embodiment of the present invention. The bonding apparatus may be a die bonding apparatus comprising a bond head module 10, on which multiple pick arms 12 are rotatably arranged to bond electronic devices 56, such as semiconductor chips (see FIG. 5), onto a substrate 14. The substrate 14 is placed and secured on a substrate positioning table 16, which is mounted onto two guide rails 18 that are stacked and orthogonally arranged relative to each other on a base 20. The guide rails 18 guide the substrate positioning table 16 to be moved to various positions on a horizontal plane for accurately locating multiple bonding positions on the substrate 14 under a pick arm 12.

Once a bonding position of the substrate 14 has been positioned under the pick arm 12, the pick arm 12 may bond an electronic device 56 that it is holding onto the bonding position.

The bond head module 10 further includes a pick arm rotary motor 22 which is centrally-located on the bond head module 10 for rotating the multiple pick arms 12 relative to the substrate positioning table 16. Hence, each pick arm 12 holding an electronic device 56 may be rotated to a position above the substrate positioning table 16 for bonding the electronic devices 56 onto the substrate 14. There is also a vertical actuator 24 located over a stopping position of each pick arm 12 above a placement position over the substrate positioning table 16. The vertical actuator 24 is operative to press and apply a biasing force onto a top of the pick arm 12 located above the substrate positioning table 16 to deflect the pick arm 12 to move towards the substrate 14 during the bonding of electronic devices 56.

Figure 2:
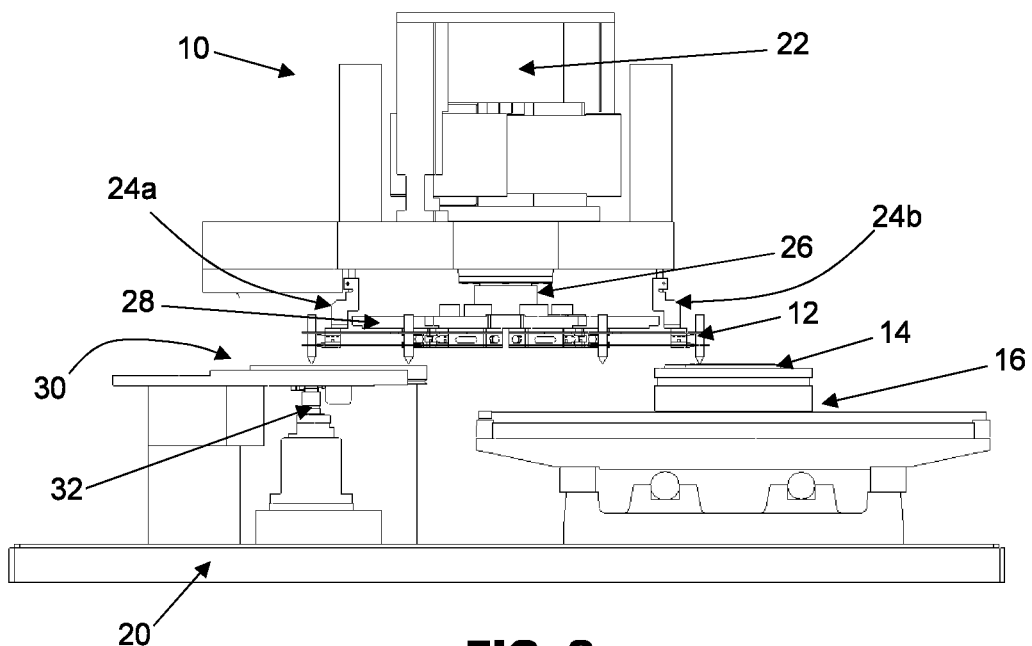
FIG. 2 is a side view of the bonding apparatus illustrated in FIG. 1.

FIG. 2 is a side view of the bonding apparatus illustrated in FIG. 1. In this view, it can be seen that a rotor mount 26 connects a pick arm support, which may be in the form of a rotary turret 28 supporting a plurality of pick arms 12 mounted along a periphery of the rotary turret 28, to the pick arm rotary motor 22. The pick arm rotary motor 22 drives the rotor mount 26 and the turret 28 to rotate, such that the pick arms 12 can be sequentially rotated to the position above the substrate positioning table 16.

The bond head module 10 depicted in the preferred embodiment of the invention is for a turret-type bonder for bonding electronic devices such as semiconductor devices to a substrate, which may be in the form of a PCB circuit board with pre-printed solder or flux. However, it should be appreciated that the pick arm 12 according to the preferred embodiment is also useable for other types of pick and place apparatus, such as a bonder comprising a single pick arm.

A supply of electronic devices 30 is located on one side of the bond head module 10, whereas the substrate positioning table 16 is located on an opposite side of the bond head module 10. The supply of electronic devices 30 may comprise a wafer ring holding a matrix of separated electronic devices, such as semiconductor chips that have been separated from a semiconductor wafer. Thus, an ejector 32 located underneath the supply of electronic devices 30 may push each electronic device 56 upwards to eject the electronic device 56 and to facilitate its pick-up by a pick arm 12 located over the electronic device 56. A pick-up actuator 24*a* is fixedly located over the supply of electronic devices 30 at a pick-up position, so as to apply a biasing force on a pick arm 12 that has moved relative to the pick-up actuator 24*a* to the pick-up position.

After the electronic device 56 has been picked up and held by a pick arm 12, the pick arm rotary motor 22 rotates the turret 28 by a predetermined angle so as to locate an adjacent pick arm 12 over the supply of electronic devices 30 to pick up another electronic device 56. Meanwhile, the electronic device 56 that has been picked up by the pick arm 12 is incrementally moved by rotation of the pick arm rotary motor 22 until the pick arm 12 arrives at a placement position over the substrate 14 that has been secured onto the substrate positioning table 16. A placement actuator 24*b* is fixedly located over the placement position for biasing the electronic device 56, so as to apply a biasing force on the pick arm 12 that has moved relative to the placement actuator 24*b* to the placement position. At this placement position, the electronic device 56 is lowered onto the substrate 14, whereat the electronic device 56 is bonded. The next pick arm 12 carrying an electronic device 56 is then conveyed to the placement position over the substrate 14 for bonding the next electronic device 56 onto the substrate 14 and so on, until all the bonding positions on the substrate 14 are occupied by bonded electronic devices 56.

Figure 3:
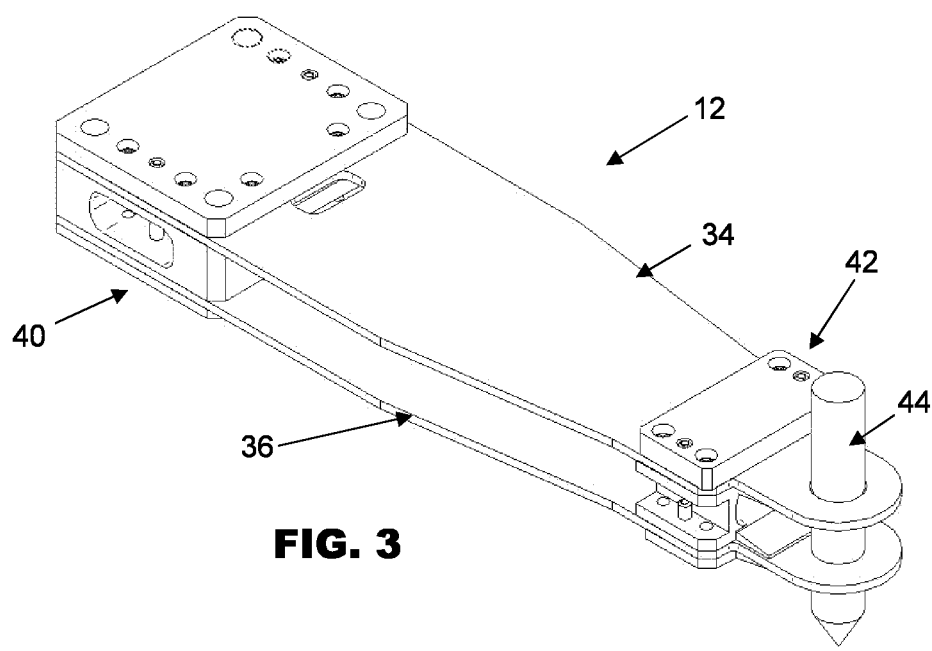
FIG. 3 is an isometric view of a pick arm in accordance with the preferred embodiment of the invention.

FIG. 3 is an isometric view of a pick arm 12 in accordance with the preferred embodiment of the invention. A main body of the pick arm 12 has a proximal end whereat the pick arm 12 is mounted or mountable onto the turret 28. A first or proximal rigid mount 40 is located adjacent to the proximal end of the pick arm 12. The pick arm also has a distal end at which a collet 44 is mounted for holding an electronic device 56. A second or distal rigid mount 42 is located adjacent to the distal end of the pick arm 12, and the distal rigid mount 42 is connected to and supported by the proximal rigid mount 40 by way of a pair of resilient support members in the form of flexures, such as a top leaf spring 34 situated at top portions of the proximal and distal rigid mounts 40, 42, and a bottom leaf spring 36 situated at bottom portions of the proximal and distal rigid mounts 40, 42.

The top and bottom leaf springs 34, 36 are separated so that a distance between the top and bottom leaf springs 34, 36 at the proximal rigid mount 40 is substantially equal to a distance between the top and bottom leaf springs 34, 36 at the distal rigid mount 42.

In this pick arm configuration, a pair of resilient support members (in the form of the top and bottom leaf springs 34, 36) have their respective opposing faces arranged substantially parallel to each other. Together, the top and bottom leaf springs 34, 36 and the first and second rigid mounts 40, 42 are constructed as a compliant four-bar mechanism. Such a compliant four-bar mechanism includes the two rigid bodies each structured to space the flexural leaf springs at equal distances and which are fixed adjacent to opposite ends of the pair of flexural leaf springs. While one of the rigid bodies (the proximal rigid mount 40) is fixedly mounted on the rotor mount 26 via the turret 28, the other rigid body (the distal rigid mount 42) is configured to be biased by the application of a pushing force from the vertical actuator 24 onto the other rigid body for controlling a vertical motion of the collet 44 of the pick arm 12. The collet 44 is mounted to the distal end of the flexural leaf springs 34, 36 so that it can be actuated by a biasing force exerted by the vertical actuator 24 onto the rigid body next to the collet 44.

Figure 4:
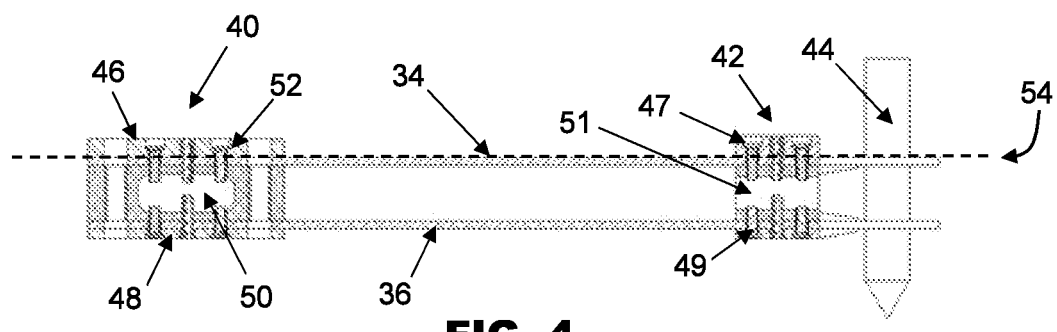
FIG. 4 is a cross-sectional side view of the pick arm illustrated in FIG. 3.

FIG. 4 is a cross-sectional side view of the pick arm 12 illustrated in FIG. 3. Spacers 50, 51 are used to separate the top and bottom portions of the proximal and distal rigid mounts 40, 42, such that the top and bottom leaf springs 34, 36 are spaced from each other at a fixed separation distance. The proximal and distal rigid mounts 40, 42 are each structured with a top locking plate 46, 47 and a bottom locking plate 48, 49.

The top locking plates 46, 47 and the bottom locking plates 48, 49 are fixed to the respective spacers 50, 51 at the proximal and distal rigid mounts 40, 42 to sandwich the top and bottom leaf springs 34, 36 in-between. Such fixation can be accomplished by any suitable means of attachment, such as using rivets 52 for riveting the respective parts together, or by applying a glue to the top and bottom leaf springs 34, 36, such as an epoxy glue or the like. The spacers 50, 51 have equal thickness so as to maintain the flexural axis of one leaf spring 34, 36 to be coincident with those of the other leaf spring. This produces an assembly which has the desired properties of axial and torsional strength.

At a standby orientation as shown in FIG. 4 when the vertical actuator 24 is at its retracted position and not exerting a biasing force on the distal rigid mount 42, a face of the top leaf spring 34 is generally arranged on a horizontal plane 54, and a face of the bottom leaf spring 36 is arranged on another horizontal plane that is parallel to the horizontal plane 54 on which the face of the top leaf spring 34 lies.

Figure 5:
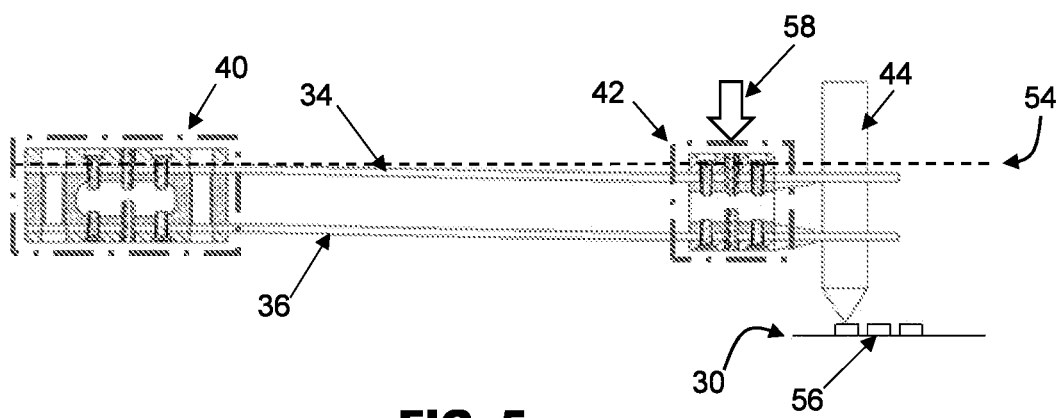
FIG. 5 illustrates a collet of the pick arm contacting an electronic device when conducting pick-up of the electronic device.

FIG. 5 illustrates a collet 44 of the pick arm 12 contacting an electronic device 56 when conducting pick-up of the electronic device 56 from the supply of electronic devices 30. In order to bias the collet 44 to contact the electronic device 56, a downward biasing force 58 is applied onto the distal rigid mount 42. This downward force 58 causes the top and bottom leaf springs 34, 36 to bend so that the distal rigid mount 42 is deflected relative to the proximal rigid mount 40 away from a horizontal plane, causing the collet 44 to also be deflected downwards below the horizontal plane 54 until the collet 44 contacts the electronic device 56. At this point, a vacuum suction force is generated at a mouth of the collet 44 so that the collet 44 may hold the electronic device 56 and pick it up from the supply of electronic devices 30.

FIG. 6A is an illustration of the pick arm 12 at its standby position. At this position, the top and bottom leaf springs 34, 36 are situated on parallel horizontal planes. A collet tip standby height 60 is such that a tip of the collet 44 is spaced from an electronic device to be picked up. In this position, the vertical actuator 24 which is attached to the bond head module 10 is at a retracted position and does not apply a biasing force 58 onto the distal rigid mount 42.

FIG. 6B is an illustration of the pick arm 12 after a vertical force is exerted on the pick arm 12 to apply a biasing force to push the distal rigid mount 42 to cause the collet 44 to move to contact an electronic device 56. In order to exert the vertical force, the vertical actuator 24 is actuated vertically downwards by a predetermined distance to push down against the distal rigid mount 42. The vertical actuator 24 is configured to move by the predetermined distance such that the top and bottom leaf springs 34, 36 are bent and the tip of the collet 44 is lowered below the collet tip standby height 60 to a sufficient extent such that it contacts the electronic device 56 to be picked up. Optionally, the ejector 32 may at the same time push the electronic device 56 upwards towards the collet 44, in which case the collet 44 may be moved downwards to a smaller extent.

A vacuum suction force is generated at the mouth of the collet 44 at this point so that the collet 44 may hold the electronic device 56. Thereafter, the vertical actuator 24 may be retracted again so that the biasing force 58 is no longer exerted to bend the top and bottom leaf springs 34, 36, and therefore, the top and bottom leaf springs 34, 36 revert to their standby positions arranged on the parallel horizontal planes 54. Once the top and bottom leaf springs 34, 36 are no longer biased and return to the horizontal planes, the pick arm rotary motor 22 may drive the turret 28 to rotate the pick arm 12 holding the electronic device 56 to an incremental rotary position towards the substrate positioning table 16 for bonding the electronic device 56 onto the substrate 14.

Care should be taken in the alignment of the axes of the two leaf springs 34, 36 during assembly, so as to ensure that the flexural leaf springs are able to operate within specified limits that are desired for stable performance. Since the leaf springs 34, 36 are susceptible to damage due to angular deflections beyond a certain limit, a vertical displacement of the distal rigid mount 42 of less than 4 mm is preferably allowable, and the degree of displacement is controllable by software. The leaf springs 34, 36 may be made of any suitably resilient material, such as an austenitic stainless steel sheet (SUS301 or SUS304) or a carbon fiber sheet. If a carbon fiber sheet is used, a moment of inertia of the pick arm 12 can be reduced by about 20% as compared with a conventional pick arm incorporating a cage bearing design. In summary, this flexure bond arm can provide a lighter mass, a smaller moment of inertia and a more stable endpoint settling, resulting in more accurate pick and place operations for electronic devices. Beneficially, smaller transverse and longitudinal vibrations are experienced due to the higher rigidity of this flexural design.

There are many other advantages of the pick arm 12 as described in the preferred embodiment of the invention. First, the manufacturing cost of the pick arm 12 is lowered because of the reduction of parts as well as avoiding the need for complex assembly operations. Moreover, due to the flexural construction of the pick arm 12, it is less prone to damage as compared to conventional pick arms. Higher precision and rigidity in relation to the flexural axes are achieved since the assembly eliminates unnecessary side play which are commonly experienced in conventional bearing guides. Furthermore, both the longitudinal and transverse directions of the pick arm 12 are relatively strong, with less torsional and longitudinal vibrations as compared with the prior art.

It should be appreciated that the use of a pair of leaf springs on a single or a multiple-pick arm design is not limitative of the present invention, but is described by way of example only. The use of such a pick arm 12 is not limited to applications in a die bonder, but may be used in any machine design in which a precise joint connection is required for the manipulation of devices. Instead of a pair of leaf springs, two pairs of leaf springs may be used, where two leaf springs are deployed instead of one along each plane. Of course, other variations of the specific construction and arrangement of the pick arm 12 that is disclosed above can be made by those skilled in the art without departing from the invention as defined in the appended claims.

Although the present invention has been described in considerable detail with reference to certain embodiments, other embodiments are also possible.

Therefore, the spirit and scope of the appended claims should not be limited to the description of the embodiments contained herein.

The invention claimed is:

1. A pick arm for a pick and place apparatus for electronic devices, comprising:
   a main body having a proximal end whereat the pick arm is mountable onto a pick arm support, and a distal end at which a collet is mounted for holding an electronic device;
   a first rigid body located adjacent to the proximal end of the pick arm and a second rigid body located adjacent to the distal end of the pick arm
   first and second flexures connecting the first rigid body to the second rigid body, the first flexure being spaced from the second flexure, and the first and second flexures having opposing faces that are arranged substantially parallel to each other; and
   an actuator operative to apply a biasing force onto the second rigid body so as to bend the first and second flexures relative to the first rigid body for biasing the collet of the pick arm to move.

2. The pick arm as claimed in claim 1, wherein the pick arm support comprises a rotary turret, the rotary turret being configured for mounting a plurality of pick arms along a periphery of the rotary turret.

3. The pick arm as claimed in claim 1, wherein the actuator comprises a placement actuator which is fixedly located over a placement position for bonding electronic devices, and the pick arm is movable relative to the placement actuator so as to be located adjacent to the placement actuator so as to be biased by the placement actuator at the placement position.

4. The pick arm as claimed in claim 3, wherein the actuator further comprises a pick-up actuator which is fixedly located over a supply of electronic devices at a pick-up position, and the pick arm is movable relative to the pick-up actuator so as to be located adjacent to the pick-up actuator so as to be biased by the pick-up actuator at the pick-up position.

5. The pick arm as claimed in claim 1, wherein the first flexure is mounted on top portions of the first and second rigid bodies and the second flexure is mounted on bottom portions of the first and second rigid bodies.

6. The pick arm as claimed in claim 5, wherein a distance between the first and second flexures at the first rigid body is substantially equal to a distance between the first and second flexures at the second rigid body.

7. The pick arm as claimed in claim 6, wherein a flexural axis of the first flexure is coincident with a flexural axis of the second flexure.

8. The pick arm as claimed in claim 5, wherein the first and second flexures and the first and second rigid bodies are constructed as a compliant four-bar mechanism, wherein the second rigid body is configured to be biased by the actuator for controlling a vertical motion of the collet.

9. The pick arm as claimed in claim 5, wherein each rigid body includes a spacer separating the first and second flexures, a top locking plate for locking the first flexure to each rigid body, and a second locking plate for locking the second flexure to each rigid body.

10. The pick arm as claimed in claim 9, wherein fixation of the first and second flexures to the top and bottom locking plates is conducted by either riveting or the application of glue to the first and second flexures.

11. The pick arm as claimed in claim 1, wherein at a standby orientation of the pick arm when no biasing force is being applied by the actuator, the faces of the first and second flexures are arranged on respective horizontal planes.

12. The pick arm as claimed in claim 11, wherein the application of the biasing force by the actuator onto the second rigid body causes the first and second flexures to bend so that the second rigid body is deflected away from the horizontal planes.

13. The pick arm as claimed in claim 1, wherein the actuator is movable by a predetermined distance between a retracted position whereat the actuator is not exerting a biasing force on the second rigid body and an extended position to apply a biasing force to push the second rigid body to move.

14. The pick arm as claimed in claim 13, wherein the distance moved by the second rigid body when pushed by the actuator is restricted to less than 4 mm.

15. The pick arm as claimed in claim 1, wherein the first and second flexures each comprises a leaf spring.

16. The pick arm as claimed in claim 15, wherein the first and second flexures are made from an austenitic stainless steel sheet or a carbon fiber sheet.

* * * * *